United States Patent [19]

Jackson et al.

[11] Patent Number: 5,004,317
[45] Date of Patent: Apr. 2, 1991

[54] WIRE BOND CONNECTION SYSTEM WITH CANCELLATION OF MUTUAL COUPLING

[75] Inventors: Kenneth P. Jackson, Danbury, Conn.; Norman Raver, Yorktown Heights, N.Y.

[73] Assignee: International Business Machines Corp., Armonk, N.Y.

[21] Appl. No.: 460,418

[22] Filed: Jan. 3, 1990

[51] Int. Cl.5 .......................... G02B 6/36; H08K 1/18
[52] U.S. Cl. .................................. 350/96.20; 361/400
[58] Field of Search ............... 350/96.20, 96.21, 96.22, 350/96.23; 361/400, 403, 408

[56] References Cited

U.S. PATENT DOCUMENTS 4,758,805  7/1988  Yamazaki et al. .................... 333/12
4,782,310  11/1988  Saburi et al. ......................... 333/167

Primary Examiner—William L. Sikes
Assistant Examiner—Phan T. Heartney
Attorney, Agent, or Firm—Perman & Green

[57] ABSTRACT

In an electrical circuit including a first array and a second array of electrical components mounted on a circuit board having an electrically conductive cladding, there is provided a system for interconnecting the components of the first array to the components of the second array with parallel signal channels for reduction of crosstalk among the channels. In each of the channels, there is one electrically conductive strip formed within the cladding and providing for a path of current in a first direction, and a second conductive path for current in the reverse direction. The second path includes a wire lead formed as a partial loop extending in a plane perpendicular to a plane of the cladding, and also includes a pad formed of material of the cladding and coplanar with the conductive strip. The pad is connected to a terminus of the wire loop. The pad is insulated from the conductive strip and forms therewith a portion of a loop which generates a magnetic field in the presence of currents flowing through the two paths. Magnetic coupling provided by the wire loops has a positive coefficient of mutual inductance which cancels negative mutual inductance of loops lying in a plane of the cladding to reduce crosstalk among the channels.

4 Claims, 3 Drawing Sheets

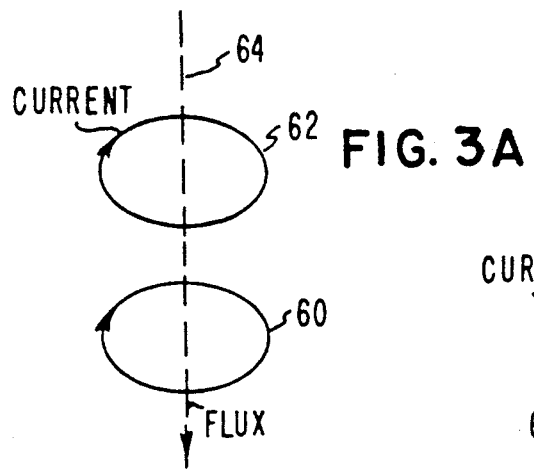
FIG. 3A
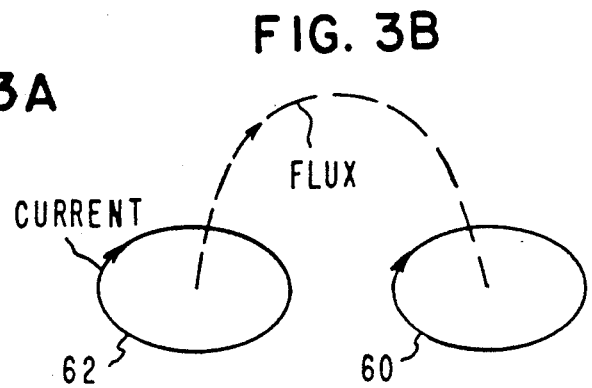
FIG. 3B
FIG. 4
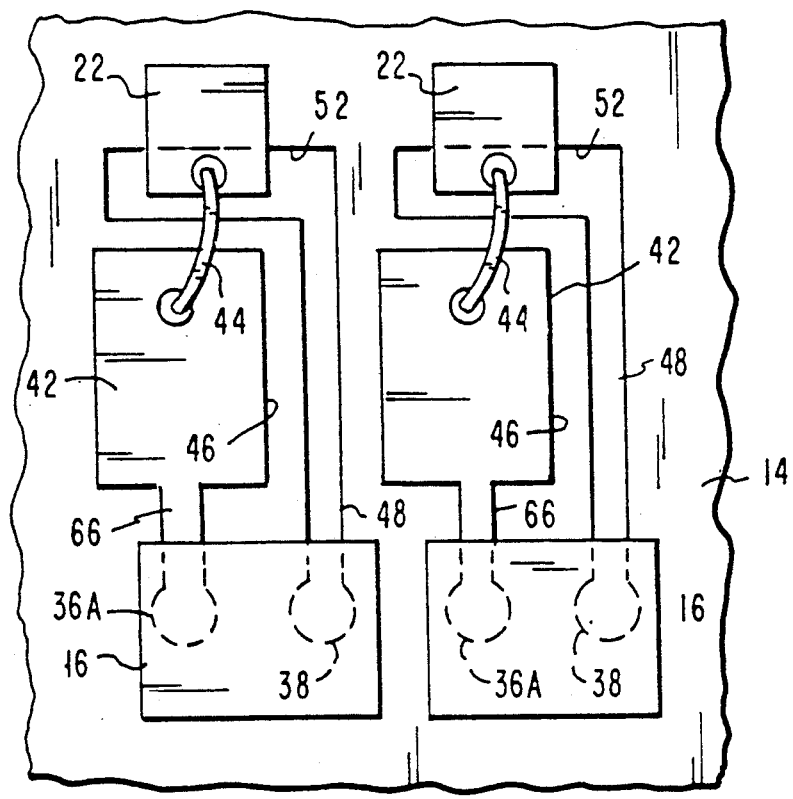

WIRE BOND CONNECTION SYSTEM WITH CANCELLATION OF MUTUAL COUPLING

BACKGROUND OF THE INVENTION

This invention relates to the use of wire bond connections among a set of electrical components mounted on a metal clad circuit board and, more particularly, to the inclusion of a system of cut-out regions in the metal cladding to reduce mutual coupling between adjacent wire connections for substantial elimination of crosstalk between parallel electric circuits.

Various forms of construction are employed in building electrical circuits. The form of construction varies in accordance with the types of components which are to be interconnected. By way of example, one common form of construction employs the interconnection of numerous circuit modules upon a circuit board which serves to support the circuit modules. Frequently, the circuit board is clad, at least on a top surface thereof facing the modules, with an electrically-conductive sheet, such as a metal sheet. Portions of the sheet my be cut away to form conductive strips which interconnect various terminals of the circuit modules. In the case of certain modules, manufacture of the circuit is facilitated by the use of relatively short wire segments which are spaced apart from the circuit board, and make direct connection among various terminals of the circuit modules.

A situation of particular interest employing the foregoing construction with the external wire segments is found in optical communications wherein solid-state lasers are employed as transmitting elements for generating short-duration light pulses which are radiated from individual ones of the lasers into corresponding optical fibers of a set of optical fibers constituting an optical transmission line. By way of example, a solid-state laser may be constructed in the form of a diode of gallium-aluminum-arsenide which generates a pulse of light upon excitation of the diode with a suitable pulse of current.

An electro-optical transmitter employing a set of laser diodes may be constructed by use of a circuit board which supports laser driver circuits and the laser diodes, the latter being excited by the driver circuits. The driver circuits are formed as individual modules. Also, each of the laser diodes is formed as an individual module including terminals for receipt of the electrical current, and also having a light-output port through which light is directed to an end of an optical fiber. Due to the physical shapes of the modules, it is the present manufacturing practice to connect some of the terminals of the modules by the metallic sheet or cladding on a circuit board, while other ones of the terminals are interconnected by segments of electrically-conductive wires.

In a typical arrangement of the electro-optical transmitter, the modules are arranged in a set of parallel channels wherein each channel has a driver module, the laser diode, and an optical fiber. The wire segments which interconnect the components of the respective channels are disposed parallel to each other in an array of wire segments.

A problem arises in that the wire segments are sufficiently close to each other to introduce a significant amount of mutual magnetic coupling of electric signals conducted by the wire segments in the respective signal channels. This results in crosstalk or coupling of signals between the channels. The reliability of the electro-optical communication is reduced because the crosstalk acts as a source of noise which may introduce error in the communication. It is noted that in the typical electro-optical communication system, pulse modulation of an optical carrier is employed. Pulse modulation rates as high as one GHz (gigahertz) are available at the present time. At such high pulse frequencies, wire segments having lengths of approximately one millimeter or less can have strong magnetic coupling for crosstalk between the wire segments.

By way of example in the construction of electric circuits with printed circuit boards, Yamazaki et al, U.S. Pat. No. 4,758,805 discloses in FIGS. 7 and 19 connections in the form of partial loops from pins to conductive strips on a circuit board. Similar construction is shown in FIGS. 2 and 8 of Saburi et al, U.S. Pat. No. 4,782,310.

SUMMARY OF THE INVENTION

The aforementioned problem is overcome and other advantages are provided by a system for interconnecting components on a circuit board wherein connections are made both by conductive strips on a surface of the board and by wire segments spaced apart from the circuit board. In accordance with the invention, the system provides for a modification of connections by wire segments by serially connecting each wire segment with a configuration of strip conductors which provides for a mutual magnetic coupling among adjacent signal channels which is of the opposite sense to a mutual coupling among the wire segments. By the introduction of both positive and negative coefficients of mutual inductance, there is significant cancellation of the crosstalk. While it is possible, theoretically, to completely cancel the net mutual coupling and the crosstalk, as a practical matter in the construction of the circuit of the plural channels of an electro-optical transmitter, it is anticipated that there will be some variation in the configuration of the various partial wire segments such that the opposed mutual coupling formed within the configuration of conductive strips cannot completely balance and compensate for the mutual coupling among the wire segments. Thus, the interconnection system of the invention can accomplish significant cancellation of the mutual coupling and the crosstalk.

The methodology involved in constructing the compensating mutual coupling can be explained as follows. An array of wire segments arranged parallel to each other, with each wire segment being part of an electro-optical signal transmission channel, can be viewed as an array of loops or partial loops disposed in planes parallel to each other. The planes are perpendicular to the metal-clad surface of the circuit board. This arrangement of the loops is similar to the coaxial arrangement of the loops of wire in a solenoid wherein a magnetic field has lines of flux which pass through and link equally the respective loops of wire in the solenoid. As is well known, in such a configuration of loops, the coefficients of inductance and mutual coupling are both positive. However, there is an alternative configuration which can be viewed by considering the case of two loops of the foregoing solenoid. By displacing one of the loops relative to the other loop so that the two loops are arranged side by side in a common plane, and wherein the directions of positive current flow (clockwise or counterclockwise) are retained the same in both loops, it is apparent that a magnetic field induced in a first of the loops must curve around in a circular path to intercept the second loop. Thus, the magnetic field passes through the second loop in the reverse direction from the previous case. This results in a negative mutual inductance.

The development of the desired compensating mutual inductance is accomplished in a preferred embodiment of the invention by etching electrically conductive paths in the metallic sheet which serves as a cladding of the circuit board. The etching provides a border circumscribing each pad and insulating the pad from the rest of the cladding. In the array of parallel signal channels, the pads are arranged side-by-side, each pad surrounded by its border, and the borders of the successive pads are spaced apart by electrically conductive strips. Each electrically conductive strip serves as a path for the transmission of current between circuit modules of the respective signal channels.

Each wire segment, instead of extending the full distance from one circuit module to the next circuit module in the signal channel, extends only as far as an end of the conductive pad in the signal channel. Thereupon, the current in the wire segment travels along the pad for a predetermined distance after which the current is fed from the pad to the next component. The connection from the pad to the next component may be accomplished by either a further loop or partial loop of wire segment, or may be accomplished by a strip conductor extending from the pad to the next circuit module. Current flowing through a wire loop in a signal channel flows about the loop in a plane perpendicular to the cladded surface of the circuit board. However, current, flowing forward to the next component by way of the pad, flows within the plane of the cladding. Current, returning from the foregoing component by way of the conductive strip between adjacent borders, also flows within the plane of the cladding. The forward and returning currents are coplanar in the vicinity of the pad, and produce effectively a loop of current disposed parallel to the cladded surface of the circuit board.

The foregoing construction of the two loops in each signal channel provides for one loop which is perpendicular to the cladded surface and a second loop which is parallel to the cladded surface of the circuit board. In view of the fact that the channels are arranged parallel to each other, the loops which are disposed perpendicularly to the cladded surface can be described electrically in terms of positive mutual magnetic coupling, while the loops of the successive channels which lie parallel to the cladded surface can be characterized electrically as having a negative mutual magnetic coupling. The loops lying parallel to the cladded surface may be elongated and may be broadened to provide a geometric configuration having a desired amount of mutual coupling for canceling the mutual coupling of the wire-segment groups.

In particular, the mutual coupling increases with increasing length of a segment of the border lying between the conductive strip and the pad at each channel, and also increases with increasing width of the border segment. This is in accordance with the general theory of mutual coupling wherein the coupling is proportional to the amount of magnetic flux linking each loop. Thereby, by using a predetermined length for each of the wire segments in constructing the wire loops perpendicular to the cladded surface, the dimensions of the pads, the dimensions of the insulating borders surrounding the respective pads, and the dimensions of the conductive strips separating the adjacent borders of the respective pads can be selected to provide the requisite amount of mutual coupling for negating the mutual coupling among the wire loops. Thereby, the invention accomplishes its goal of essentially canceling the unwanted mutual coupling and the crosstalk associated therewith between the adjacent signal channels.

BRIEF DESCRIPTION OF THE DRAWING

The aforementioned aspects and other features of the invention are explained in the following description, taken in connection with the accompanying drawing wherein:

FIGS. 3A and 3B together demonstrate magnetic coupling with positive and negative mutual inductance among a pair of electrically conductive wire loops disposed in different configurations of position relative to each other; and FIG. 4 shows in plan view, partially stylized, an alternative embodiment to the structure of FIG. 2.

DETAILED DESCRIPTION

Figure 1:
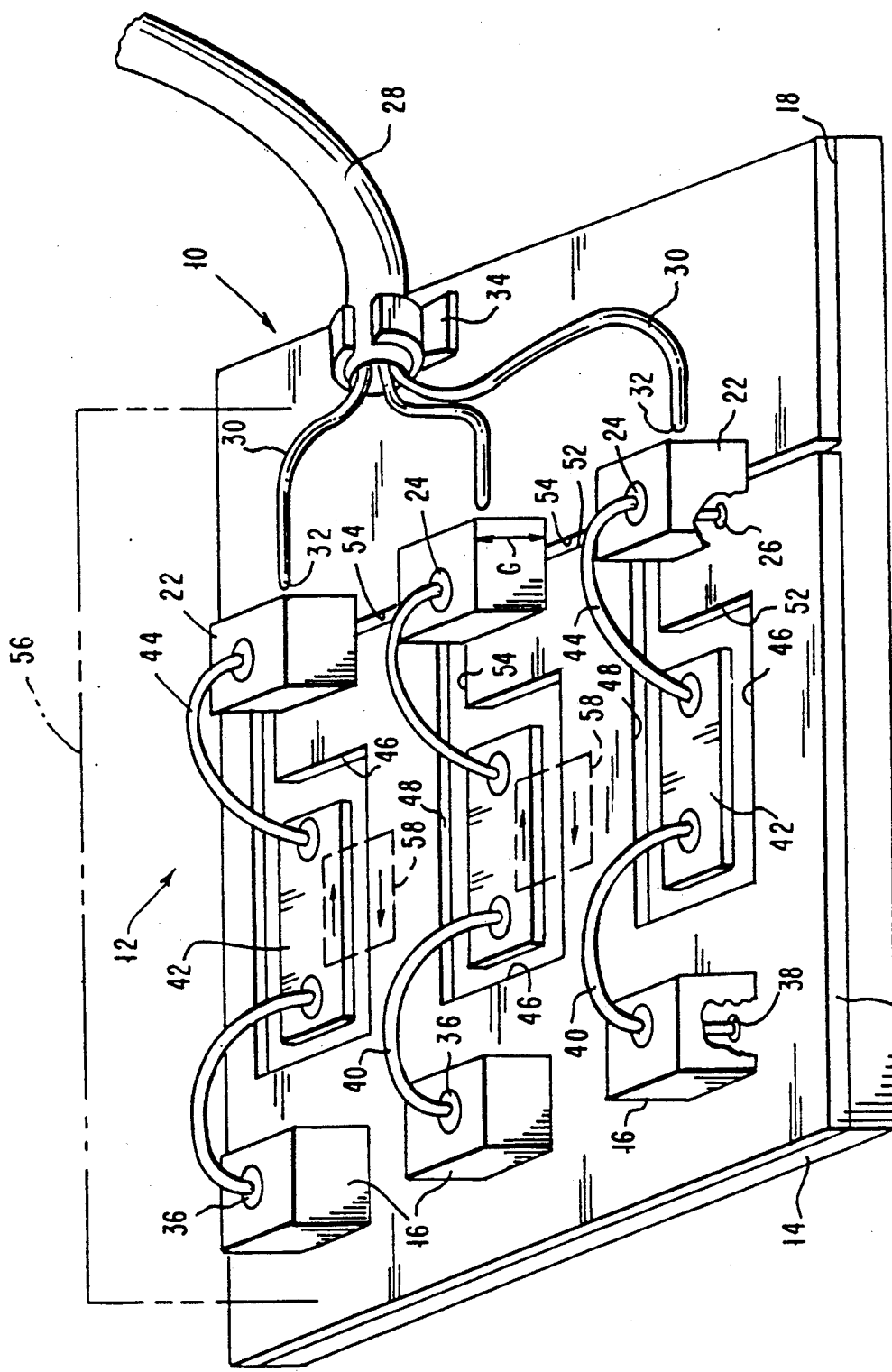
FIG. 1 is a simplified perspective view, partially stylized, of an electro-optical communication system with electronic component modules supported on a circuit board, and wherein electrical connections are made both by wire loops and strip conductors in accordance with the invention.
Figure 2:
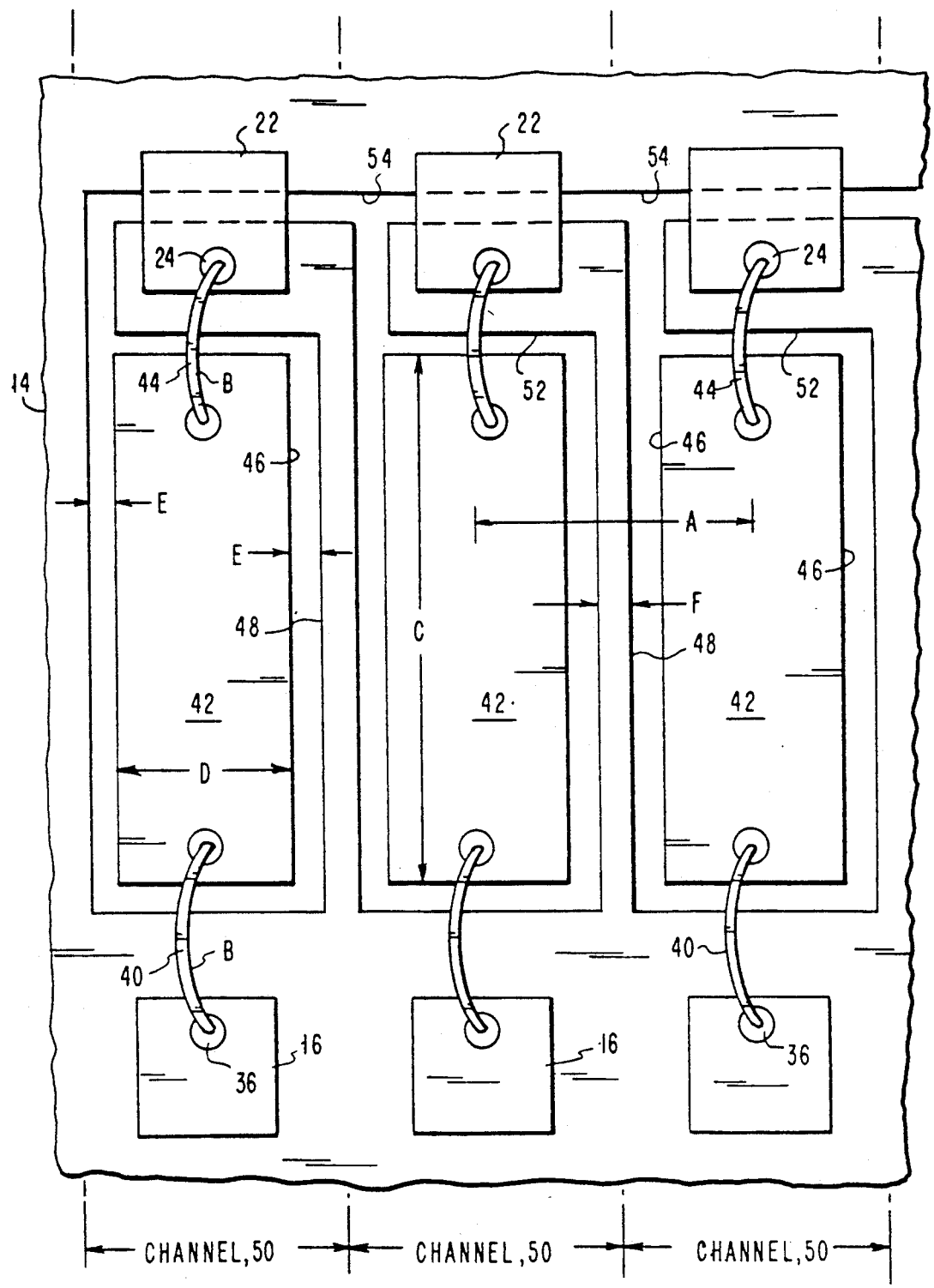
FIG. 2 is a plan view of an enlarged fragmentary portion of FIG. 1 with important dimensions of the pad structure being identified therein.

With reference to FIGS. 1-2, there is shown circuitry 10 in the transmitting portion of an electro-optical communication system 12, the circuitry being built upon a circuit board 14, and including circuit modules 16 supported on a top surface 18 of the board 14. The term "top" is used by way of convenience in describing the circuit board 14 as shown in FIG. 1, it being understood that, in practice, the board 14 may be oriented horizontally, vertically, or in some other orientation. The board 14 is formed of electrically-insulating, dielectric material, such as fibrous glass embedded in epoxy by way of example, or as a silicon substrate, by way of further example, and includes an electrically conductive cladding 20 covering at least a portion of the top surface 18. Typically, the cladding 20 is formed of a thin metal sheet such as a copper sheet.

Also included within the circuitry 10 is a set of solid-state lasers 22, each laser 22 being formed typically, of a diode of gallium-aluminum-arsenide. Each of the lasers 22 is constructed in modular form, and may be supported by the board 14 or a separate support (not shown) coplanar with the board 14. Each laser 22 has two terminals, namely, a first terminal 24 located at a top portion of the laser 22 and a second terminal 26 located at a bottom portion of the laser 22. Electric current is to be applied via the terminals 24 and 26 to the laser 22 for activating the laser to emit radiation, which may be referred to as light, even though such radiation may be in the infrared region of the electromagnetic spectrum a typical wavelength being 840 nanometers.

The communication system 12 includes an optical cable 28 having individual fibers 30 which are optically coupled to respective ones of the lasers 22. Each of the lasers 22 has an output port 22 (not shown in the figures) though the light is emitted to impinge upon an end surface 32 of a respective optical fiber 30 located in front of the laser output port. The fibers 30 and the cable 28 are held in position by a suitable support 34 which may stand upon the board 14 or upon some other structure (not shown) adjacent to the board 14.

Each of the circuit modules 16 may be provided with a set (not shown) of numerous contacts for making electrical connection with other circuit elements including power supplies and signal generators which have been deleted in the drawing to facilitate presentation of the inventive features of the circuitry 10. Electrical connection with such contacts may be made by electrical strip conductors formed within the cladding 20 in accordance with manufacturing procedures well known in the construction of printed-circuit boards. Of particular interest in the practice of the invention is the fact that each circuit module 16 has a pair of output terminals, namely, a first terminal 36 located on a top of the module 16 and a second terminal 38 located on a bottom of the module 16, for outputting electric drive current to activate the laser 22.

In accordance with the invention, each of the circuit modules 16 applies current to a single one of the lasers 22. Connection of the terminals 36 and 38 of a module 16 with the terminals 24 and 26, respectively, of the corresponding laser 22 is made as follows to provide a path of current flow between the module 16 and the laser 22. Current flows along this path from the first terminal 36 of the module 16 to the first terminal 24 of the laser 22, and returns to the module 16 from the second terminal 26 of the laser 22 to the second terminal 38 of the module 16. Connection of the first terminal 36 to the first terminal 24 is made by a serial connection of an output lead 40, an electrically conducting pad 42, and an input lead 44.

The pad 42 is formed from material of the cladding 20 and is constructed as an island surrounded by an electrically-insulating border 46 which separates the pad 42 from the remainder of the cladding 20. The border 46 is formed by etching away the metallic material of the cladding 20, and may be left as an empty trough (as portrayed in the drawing), or may be filled with electrically-insulating potting material such as epoxy. Connection between each of the modules 16 and its corresponding laser 22 is made in the same fashion, there being a pad 42 disposed between each of the modules 16 and its corresponding laser 22.

Thus, it is shown in FIGS. 1–2, the pads 42 are arranged side-by-side in an array, with each pad 42 being surrounded by its border 46. The border 46 of one of the pads 42 is separated by an electrically conductive strip 48 from the border 46 of the next pad 42. The conductive strip 48 which serves as a return path for electrical current and connects between the second terminal 26 of a laser 22 to the second terminal 38 of the corresponding module 16. The return current path provided by a strip 48 is located to the right side of the pad 42 so as to provide the identical configuration of interconnection structure between each of the modules 16 and their respective lasers 22. Each module 16 with its laser 22 and the interconnecting structure may be regarded as a signal channel 50. If desired, the return current paths provided by the strips 48 could be placed to the left side of each of the pads 42 (not shown); however, it is important in the practice of the invention that the return current path provided by the strip 48 be on the same side of the pad 42 in each of the signal channels 50.

As shown in FIG. 1, a portion of the module 16 has been cut away to show connection of the second terminal 38 with the cladding 20 and the strip 48 formed from the cladding 20. The output lead 40 of the module 16 extends from the first terminal 36 of the module 16 to a first end portion, to be referred to as the front, of the pad 42. The input lead 44 extends from a second end portion, to be referred to as the back, of the pad 42 to the first terminal 24 of the laser 22. A portion of the laser 22 is cut away to show the second terminal 26 and its connection to an enlarged distal end 52 of the strip 48. The distal end 52 has been enlarged to facilitate locating the second terminal 26 upon the strip 48. It is noted that the distal end 52 is separated from the rest of the cladding 20 by an electrically-insulating boundary 54 which extends from the border 46 of a pad 42 in one signal channel 50 to the border 46 of the pad 42 in the next signal channel 50. Preferably, the boundary 54 is formed by etching away material of the cladding 20 to form a trough. The boundary 54 may be left in the form of an open trough, or may be filled with electrically-insulating potting material such as epoxy.

By way of alternative embodiments in the construction of the invention, it is noted that in an experimental model of the invention, the boundaries 54 were not constructed, and the distal ends 52 of the strips 48 were in electrical contact with the rest of the cladding 20. As a result, returning electric current from a laser 22 would flow primarily via the strip 48 nearest the second terminal 26 and the second terminal 38 of the signal channel 50 due to resistivity in the metal cladding 20. However, return current would also flow through other ones of the strips 48. Nevertheless, this experimental model of the invention did produce beneficial cancellation of mutual inductance between the signal channels because a major part of the current flows through one of the strips 48. However, in order to have a more precise control over the cancellation of mutual inductance, it is preferable to have well defined paths of current flow. Such well defined paths are attained by construction of the boundary 54, as depicted in FIGS. 1 and 2, to ensure that all of the return current from a laser 22 flows within the strip 48 of the signal channel 50, rather than being dispersed among other ones of the strips 48. Accordingly, the boundary 54 is provided in each of the signal channels 50 in the preferred embodiment of the invention.

Each of the output leads 40 and each of the input leads 44, in the embodiment is constructed of a partial loop of electrically conducting material, such as copper wire, and is oriented in a plane, such as the plane 56, which is perpendicular to the top surface 18 of the board 14. The wire loops of the output leads 40 are arranged side-by-side in an array. Similarly, the wire loops of the input leads 44 are arranged side-by-side in an array. The arrangement of the wire loops of the output leads 40 allows for the generation of magnetic fields produced by currents flowing in the output leads 40, the magnetic fields having flux which links the loops to provide for a positive coefficient of mutual coupling. Similarly, currents flowing in the input leads 44 generate magnetic flux which so links the loops to provide for a positive coefficient at mutual coupling.

In each of the signal channels 50, there is a partial loop 58 in the plane of the cladding 20, depicted in FIG. 1 by a dashed line, wherein current flows towards a laser 22 along one side of a border 46 and returns from the laser 22 along the opposite side of the border 46. The directions of current flow are indicated by arrows in the loop 58. To facilitate the description, the partial loop will be referred to simply as a loop, it being understood that the loop consists of only two parallel current paths disposed parallel to each other on opposite sides of a segment of a border 46. In each of the signal channels 50, current flows in the clockwise direction in each of the loops 58.

The flow of currents in the loops 58 generates magnetic flux which passes through the loops in a direction normal to the plane of the cladding 20 and circulates around, in a flux path plane perpendicular to the cladding plane, to intercept a neighboring loop 58 to provide a coefficient of mutual coupling which is negative. Therefore, contiguous signal channels 50 are linked magnetically by both positive and negative components of mutual inductance. By adjusting the length and width of the segment of the border 46 in each loop 58, the negative and the positive components of the mutual inductance can be made equal so as to cancel. The cancellation of the mutual inductance is a major feature of the invention which significantly reduces crosstalk among the various signal channels 50.

The cancellation of the mutual inductance is demonstrated with reference to FIGS. 3A and 3B. In FIG. 3A, two loops 60 and 62 of wire are arranged coaxially to each other about an axis 64, and are disposed adjacent to each other, one above the other. Currents flow in the positive sense in each of the loops 60 and 62 counterclockwise as indicated by arrows on each of the loops. In FIG. 3B, loop 62 has been translated to the left and set alongside of and coplanar with the loop 60. The positive sense of current flow remains counterclockwise in each of the loops 60 and 62 as indicated by the arrows of the loops. In FIG. 3A, magnetic flux produced by current in either of the loops is directed downward along the axis 64 and links both of the loops 60 and 62. In FIG. 3B, flux produced by current in the loop 60 is directed downward through the loop 60 and travels along a curved path to pass through the loop 62 in the upward direction. This is the reverse of the situation depicted in FIG. 3A wherein flux produced by current in the loop 60 is directed downward through the loop 62. As a result, mutual inductance in the situation of FIG. 3A has a sense which is opposite the sense of the mutual inductance in the situation of FIG. 3B.

In FIG. 3A, in response to a positive change in magnitude of current flow in the loop 60, there is induced a back electromotive force producing a voltage drop in the positive direction of current flow in the loop 60, this being represented by a positive value of inductance. There is also produced a positive voltage drop in the direction of current in the loop 62, this being represented by a positive coefficient of mutual inductance. In contrast, in the situation of FIGS. 3B, a positive increase of current flow in the loop 60 produces a voltage drop in the loop 62 which is directed opposite the direction of positive current flow, this being represented by a negative coefficient of mutual inductance. Upon comparing the two situations depicted in FIGS. 3A and 3B with the arrangement of the electrical conductors of FIG. 1, it is seen that the arrangements of the partial loops of the output leads 40 and of the input leads 44 correspond to the arrangement of the loops 60 and 62 of FIG. 3A.

The arrangement of the loops 58 disposed in the common plane of the cladding 20 corresponds to the arrangement of the loop 60 and 62 of FIG. 3B. Therefore, the various signal channels 50 experience a magnetic coupling via positive mutual inductance of the output leads 40 and of the input leads 44 while experiencing magnetic coupling via negative mutual inductance in the loops 58. As noted above, in accordance with the invention, the dimensions of the current conducting elements in the loops 58 are adjusted to provide for a magnitude of negative mutual coupling which cancels the positive mutual coupling to produce a significant reduction in a crosstalk among the signal channels.

FIG. 5 shows an alternative embodiment of the invention wherein the circuit modules 16 have been reconfigured to locate the first terminal at the bottom of the module 16, the first terminal being identified as 36A in its location at the bottom of the module 16. With this configuration of the modules 16, the output leads 40 of FIG. 2 are eliminated. Connection of the first terminal 36A in each of the modules 16 is provided by a strip conductor 66 which is formed from the material of the cladding 20. The strip conductor 66 extends from the terminal 36A to the front of the corresponding pad 42. In view of the removal of the output lead 40, there is less coupling of the magnetic field among the signal channels 50 by mutual inductance with the positive coefficient. Accordingly, the configuration of each of the loops 58 is to be altered to reduce the magnitude of coupling with a negative coefficient of mutual inductance.

As shown in FIG. 5, the configuration of the border, identified as the border 46A in FIG. 5, has been changed from that of the border 46 of FIGS. 1 and 2 to accommodate the new connection between the first terminal 36A and the pad 42. Therein, the length of the pad 42 between front and back portions of the pad is reduced to provide for reduced coupling between the loops 58. With either the configuration of the embodiments of FIGS. 1 and 5, the invention provides for substantial cancellation of the magnetic coupling for reduction in crosstalk so as to provide for improved digital communication with reduced error rate.

It is noted that any number of the signal channels 50 may be employed. To facilitate the drawing, only three of the channels 50 are portrayed in FIG. 2. However, in the aforementioned experimental model, four of the channels 50 where constructed. Many more channels may be constructed on a single circuit board, for example, there may be thirty two channels. In the construction of the foregoing experimental model, the following dimensions were employed. The dimensions are identified in FIG. 3. The spacing, A, on centerlines between contiguous channels is equal to 200 microns. The length, B, of a wire segment employed for either a lead 40 or 42 is equal to 500 microns, the cross section of the wire being square and measuring 25 microns on a side. The length, C, of a pad 42 is equal to 500 microns. The width, D, of a pad 42 is equal to 125 microns. The width, E, of a segment of the border 46 surrounding a pad 42 is equal to 25 microns. The width, F, of the conductive strip 48 between the borders 46 of successive pads 42 is equal to 25 microns. The height, G, (FIG. 1) of a laser 22 is equal to 150 microns, this being approximately equal to the height of a circuit module 16.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. An interconnection system for an electrical circuit, the electrical circuit including a first array and a second array of electrical components mounted on a circuit board having an electrically conductive cladding, the system interconnecting the components of the first array to the components of the second array in parallel signal channels with prevention of crosstalk among the channels, comprising:

a plurality of wire segments arranged side by side and spaced apart in an array, each of said wire segments having a first end and a second end, the first ends of the wire segments being connected to a first terminal in each of respective components of said first array;

a plurality of electrically conductive pads arranged side by side in plane of said cladding and spaced apart in an array facing said array of wire segments, each of said pads being surrounded by an insulating border insulating the pad from the cladding, each of said pads having a first end portion and a second end portion opposite the first end portion, the second end portions of said pads being connected to a first terminal in each of respective components of said second array;

an array of conductive strips formed in said cladding and located in said cladding plane between successive ones of said pad, said borders being separated from each other by said conductive strips, said conductive strips extending from said first array of components to said second array of components to provide electrical connection between a second terminal in each component of said first array and a second terminal in each corresponding component of said second array; and wherein the second ends of said wire segments are connected to the first end portions in respective ones of said pads for communicating signals in respective ones of said signal channels, each of said wire segments forming a first partial loop disposed in a plane perpendicular to said cladding plane, the first loops providing magnetic coupling with a first mutual inductance among successive ones of said wire segments, there being segments of said borders contiguous said strips, each of said border segments defining a second partial loop parallel to said cladding plane in respective ones of said signal channels, the second loops providing magnetic coupling with a second mutual inductance among successive ones of said pads, the second mutual inductance tending to cancel the first mutual inductance for prevention of crosstalk among said signal channels.

2. A system according to claim 1 wherein said pads have a rectangular shape.

3. A system according to claim 2 further comprising a second plurality of wire segments arranged side-by-side and spaced apart in an array, each of the wire segments of said second plurality of electrically conductive pads being arranged side-by-side and spaced apart, the wire segments of said second plurality of wire segments each having a first end and a second end of which the first ends of the wire segments are connected to the first terminal in each of respective components of said second array, the second end portions of said pads being connected respectively to the second ends of said second plurality of wire segments.

4. An electro-optical transmitter for the generation and transmission of optical signals via optical fibers, the system including an array of solid-state lasers positioned for applying light to the optical fibers, an array of laser driver modules electrically connected to said lasers for exciting the lasers to generate light signals, the lasers and the drivers constituting an electrical circuit; and wherein in said electrical circuit, said drivers and said lasers are mounted on a circuit board having an electrically conductive cladding, the electrical circuit including a system for interconnecting the drivers to the lasers via parallel signal channels with prevention of crosstalk among the channels;

said interconnection system comprises a plurality of wire segments arranged side-by-side and spaced apart in an array, each of said wire segments having a first end and a second end, the first ends of the wire segments being connection to a first terminal in each of respective ones of said lasers;

a plurality of electrically conductive pads arranged side-by-side in a plane of said cladding and spaced apart in an array facing said array of wire segments, each of said pads being surrounded by an insulating border insulating the pad from the cladding, each of said pads having a first end portion and a econd end portion opposite the first end portion, the second end portions of said pads being connected to a first terminal in each of said drivers;

an array of conductive strips formed in said cladding and located in said cladding plane between successive ones of said pads, said borders being separated from each other by said conductive strips, said conductive strips extending from said lasers to said drivers to provide electrical connection between a second terminal in each of said lasers and a second terminal in a corresponding one of each of said drivers; and wherein the second ends of said wire segments are connected to the first end portions in respective ones of said pads for communicating signals in respective ones of said signal channels, each of said wire segments forming a first partial loop disposed in a plane perpendicular to said cladding plane, the first loops providing magnetic coupling with a first mutual inductance among successive ones of said wire segments, there being segments of said borders contiguous said strips, each of said border segments defining a second partial loop parallel to said cladding plane in respective ones of said signal channels, the second loops providing magnetic coupling with a second mutual inductance among successive ones of said pads, the second mutual inductance tending to cancel the first mutual inductance for prevention of crosstalk among said signal channels.

* * * * *